United States Patent [19]
Tsutsui

[11] Patent Number: 5,515,395
[45] Date of Patent: May 7, 1996

[54] CODING METHOD, CODER AND DECODER FOR DIGITAL SIGNAL, AND RECORDING MEDIUM FOR CODED INFORMATION INFORMATION SIGNAL

[75] Inventor: Kyoya Tsutsui, Kanagawa, Japan

[73] Assignee: Sony Corporation, Tokyo, Japan

[21] Appl. No.: 173,213

[22] Filed: Dec. 27, 1993

[30] Foreign Application Priority Data

Jan. 20, 1993 [JP] Japan ................................. 5-007872

[51] Int. Cl.$^6$ ....................................... H04B 1/69
[52] U.S. Cl. ................ 375/200; 380/34; 375/242; 375/243; 341/155; 341/200
[58] Field of Search ....................... 375/1, 25, 26, 375/200–210, 242, 243; 380/34; 341/155, 200

[56] References Cited

U.S. PATENT DOCUMENTS 5,260,980  11/1993  Akagiri et al. ...................... 375/25 X
5,301,205   4/1994  Tsutsui et al. ..................... 375/1

Primary Examiner—Bernarr E. Gregory
Attorney, Agent, or Firm—Jay H. Maioli; Donald S. Dowden

[57] ABSTRACT

In quantizing a digital signal in respective frequency bands by quantization units and transmitting (transmitting or recording) such quantized digital signal, second quantization accuracy information indicating a difference between first quantization accuracy information serving as a reference and actual quantization accuracy information from a quantization accuracy determination unit is coded at a quantization accuracy information coding unit to transmit the coded quantization accuracy information to thereby realize efficient coding while maintaining a degree of freedom in the manner of giving quantization accuracy. Accordingly, more efficient coding can be attained while leaving the degree of freedom in the manner of giving quantization accuracy by a lesser number of bits.

24 Claims, 8 Drawing Sheets

CODING METHOD, CODER AND DECODER FOR DIGITAL SIGNAL, AND RECORDING MEDIUM FOR CODED INFORMATION INFORMATION SIGNAL

BACKGROUND OF THE INVENTION

This invention relates to a coding method for a digital signal applied to an encoder/decoder System which is adapted to carry out coding of an input signal such as a digital audio signal, etc. to transmit or receive a coded signal through a communication medium, or record or reproduce it through a recording medium to send such coded signal to a decoder to decode it to obtain a reproduced signal, a coder using such a coding method, a decoder for decoding an information signal coded by such a coding method, and a recording medium on which an information signal coded by such a coding method is recorded.

There are various efficient coding techniques for an audio signal or a speech signal, etc. For example, there can be enumerated a subband coding (SBC) which is a frequency band division system including no coding processing using blocks (signal sample blocks) in which an audio signal, etc. on the time base is divided into signal components in plural frequency bands without dividing such a signal into blocks (signal sample blocks) to encode them; a frequency band division system including coding processing using blocks (signal sample blocks), which is so called transform coding, adapted to transform a signal on the time base to a signal on the frequency base (spectrum transform) to divide it into signal components in plural frequency bands to encode such signal components in the respective bands; and the like.

Further, there has been proposed an efficient coding technique in which the above-described subband coding (SBC) and the transform coding are combined. In this case, for example, an approach is employed to carry out a band division by the subband coding (SBC) thereafter to spectrum-transform signals in the respective bands into signals (signal components) on the frequency base to implement coding to the spectrum-transformed signal components in the respective bands. As a filter for the band division, there is, e.g., so called a QMF filter. This QMF filter is described in 1976 R. E. Crochiere, Digital coding of speech in subbands, Bell Syst. Tech. J. , Vol. 55, No. 8 1976. In addition, in ICASSP 83, BOSTON, Polyphase Quadrature filters-A new subband coding technique, Joseph H. Rothweiler, a technique for carrying out band division by using filters of equal band width is described.

Here, as the above-described spectrum transform processing, e.g., there is a spectrum transform processing to divide an input audio signal into blocks (signal sample blocks) every predetermined unit time (frame) to carry out, in every block, Fast Fourier Transform (FFT), Discrete Cosine Transform (DCT), Modified DCT (NDCT), etc. to thereby transform signal components on the time base to signal components on the frequency base. Among these transforms, MDCT is described in ICASSP 1987, Subband/Transform Coding Using Filter Bank Designs Based on Time Domain Aliasing Cancellation, J. P. Princen, A. B. Bradley, Univ. of Surrey Royal Melbourne Inst. of Tech.

By quantizing signals (signal components) divided into bands by the filter(s) or the spectrum transform in this way, it is possible to control the band in which quantizing noise takes place. In this case, it is possible to carry out more efficient coding from the viewpoint of the hearing sense by utilizing the property of the masking effect. Further, if prior to implementation of quantization, normalization is carried out in the respective bands, e.g., by a maximum value of an absolute value of a signal component in each frequency band, more efficient coding can be carried out.

As a frequency division width for quantizing respective frequency components divided into frequency bands, there is carried out a band division in which, e.g., the hearing sense characteristic of the human being is taken into consideration. Namely, there are instances where an audio signal is divided into signal components in plural bands (e.g., 25 bands) having band widths adapted to become broader according as the frequency shifts to a higher frequency band side, which are generally called critical bands. Further, in encoding data in respective bands at this time, coding by a predetermined bit allocation is carried out in respective bands, or coding by an adaptive bit allocation is carried out in respective bands. For example, in encoding coefficient data obtained after they have undergone the MDCT processing by the above-mentioned bit allocation, coding is carried out by adaptive allocated bit numbers with respect to MDCT coefficient data in respective bands obtained by MDCT processing in respective blocks. As the bit allocation technique, the following two techniques are known.

In IEEE Transactions of Accoustics, Speech, and Signal Processing, vol. ASSP-25, No. 4, August 1977, bit allocation is carried out on the basis of the magnitudes of signals in respective bands. In accordance with this system, the quantizing noise spectrum becomes flat, and the noise energy becomes minimum. However, since the masking effect is not utilized from the viewpoint of the hearing sense, the actual noise sense is not optimum. In addition, in ICASSP 1980 The critical band coder-digital encoding of the perceptual requirements of the auditory system M. A. Kransner MIT, there is described a technique in which hearing sense masking is utilized to thereby obtain necessary signal-to-noise ratios in respective bands to carry out a fixed bit allocation.

However, with this technique, even in the case of measuring the characteristic by a sine wave input, since the bit allocation is fixed, the characteristic value would take a value which is not so good. To solve such problem, an efficient coder in which all bits which can be used for bit allocation are used in such a manner that they are divided into bits for the fixed bit allocation pattern determined in advance in respective small blocks and bits for the bit allocation depending upon the magnitudes of signals of respective blocks to allow the divisional ratio to be dependent upon a signal relevant to an input signal, and to allow the divisional ratio with respect to bits for the fixed bit allocation pattern to be greater according as the spectrum of the signal becomes more smooth is proposed in, e.g., U.S. patent application Ser. No. 07/924298 filed on Aug. 3, 1992, by this applicant, now abandoned, or U.S. Pat. No. 5,222, 189 (Fielder).

In accordance with this method, in the case where the energy concentrates on a specific spectrum, like a sine wave input, many bits are allocated to a block including that spectrum, thereby making it possible to remarkably improve the entire signal-to-noise characteristic. In general, since the hearing sense of the human being is extremely sensitive to a signal having a sharp spectrum component, improvement of the signal-to-noise characteristic by using such method not only leads to an improvement in numeric values in measurement, but also is effective in improvement in the sound quality from the viewpoint of the hearing sense.

As a bit allocation method, a large number of methods are proposed in addition to the above. If the model relating to the hearing sense is caused to be finer and the ability of the coder is enhanced, more efficient coding from the standpoint of the hearing sense can be carried out.

In the system adapted for carrying out the fixed allocation, there is no necessity of transmitting bit allocation information from the coder to the decoder. Further, also in the system where bit allocation varies depending upon the frequency distribution of a signal, if normalization is carried out in respective bands to transmit their normalization coefficients to the decoder to have an ability to univocally determine bit allocation from those normalization coefficients, there is no necessity that the bit allocation information not be sent to the decoder.

However, with these methods, also in the case where the model relating to the hearing sense is caused to be finer in future so that the ability of the coder is enhanced, or the like, it was not possible to alter the bit allocation method. As a result, it was impossible to improve the sound quality or to carry out more efficient coding.

On the other hand, with the method of transmitting bit allocation information to the decoder, future improvements can be freely carried out, but many bits for transmitting bit allocation information itself were required, thus failing to carry out efficient coding.

OBJECT AND SUMMARY OF THE INVENTION

In view of these actual circumstances as stated above, this invention has been made, and its object is to provide a coding method for a digital signal which can realize more efficient coding while leaving the degree of freedom in a method of bit allocation, a coder using such a coding method, a decoder for decoding an information signal coded by such a coding method, and a recording medium on which an information signal coded by such a coding method is recorded.

This invention is characterized in that differences between bit a location information (in general, quantization accuracy information) which can be calculated by the decoder itself and actual bit allocation information are efficiently transmitted or recorded to thereby realize more efficient coding while leaving a degree of freedom in the bit allocation method.

Namely, a coding method according to this invention is characterized in that, in a coding method for the coding of a digital signal, quantization is carried out with a quantization accuracy determined by first quantization accuracy information outputted from quantization accuracy information (quantization bit allocation information, etc.) generating means and second quantization accuracy information (obtained after they have undergone transmission/reception or recording/reproduction) sent to a decoder.

Further, a coder according to this invention is characterized in that, in a coder for coding a digital signal, quantization is carried out with a quantization accuracy determined by first quantization accuracy information outputted from quantization accuracy information generating means and second quantization accuracy information sent to a decoder.

Furthermore, a decoder according to this invention is characterized in that, in a decoder for decoding a coded information signal obtained by coding a digital signal, quantization is released with a quantization accuracy determined by first quantization accuracy information outputted from quantization accuracy information generating means and second quantization accuracy information sent from a coder.

In addition, a recording medium according to this invention is characterized in that, in a recording medium on which a coded information signal in which a digital signal is coded is recorded, a coded information signal quantized with a quantization accuracy determined by first quantization accuracy information outputted from quantization accuracy information generating means and second quantization accuracy information sent to a decoder is recorded.

Here, as an actual example of the quantization accuracy information, bit allocation information in quantization is enumerated. Further, transmission of a coded information signal obtained by coding to the decoder includes not only transmission/reception through a communication medium, but also recording/reproduction through a recording medium, or the like.

It is preferable that the above-mentioned second quantization accuracy information is quantization accuracy difference information obtained by taking differences between quantization accuracy information outputted from quantization accuracy determination means and the first quantization accuracy information. Further, the first quantization accuracy information may be fixed quantization accuracy information.

In place of using the above-mentioned fixed quantization accuracy information as the first quantization accuracy information, this first quantization accuracy information may be determined by calculation on the basis of normalization coefficients. Further, in the case of implementing coding to signal components of an input digital signal divided into blocks on the time base, quantization accuracy in any other time block may be used as the first quantization accuracy information. In this case, e.g., an earlier time block may be used as the other time block.

The above-mentioned quantization accuracy information may be transmitted (transmitted or recorded) after it has undergone variable length coding, or may be transmitted while maintaining the fixed length.

Since actual quantization accuracy information in quantization is determined by first quantization accuracy information having no necessity of being sent (transmitted/received or recorded/reproduced) to the decoder and second quantization accuracy information actually sent to the decoder, quantization accuracy information to be transmitted can be reduced, so more efficient coding can be realized while maintaining the degree of freedom in the method of giving quantization accuracy such as bit allocation method, etc.

Namely, in accordance with this invention, since quantization is carried out with a quantization accuracy determined by first quantization accuracy information outputted from the quantization accuracy information generating means and second quantization accuracy information (transmitted/received or recorded/reproduced) sent from the coder to the decoder, it is sufficient to transmit only the second quantization accuracy information as compared to the case where quantization accuracy information for carrying out quantization is directly transmitted. For this reason, the degree of freedom of giving quantization accuracy can be improved by a lesser number of bits. Thus, more efficient coding can be attained while leaving room for improvement in the method of giving quantization accuracy such as bit allocation, etc. in future.

DESCRIPTION OF THE PREFERRED EMBODIMENTS

Preferred embodiments according to this invention will now be described with reference to the attached drawings.

Figure 1:
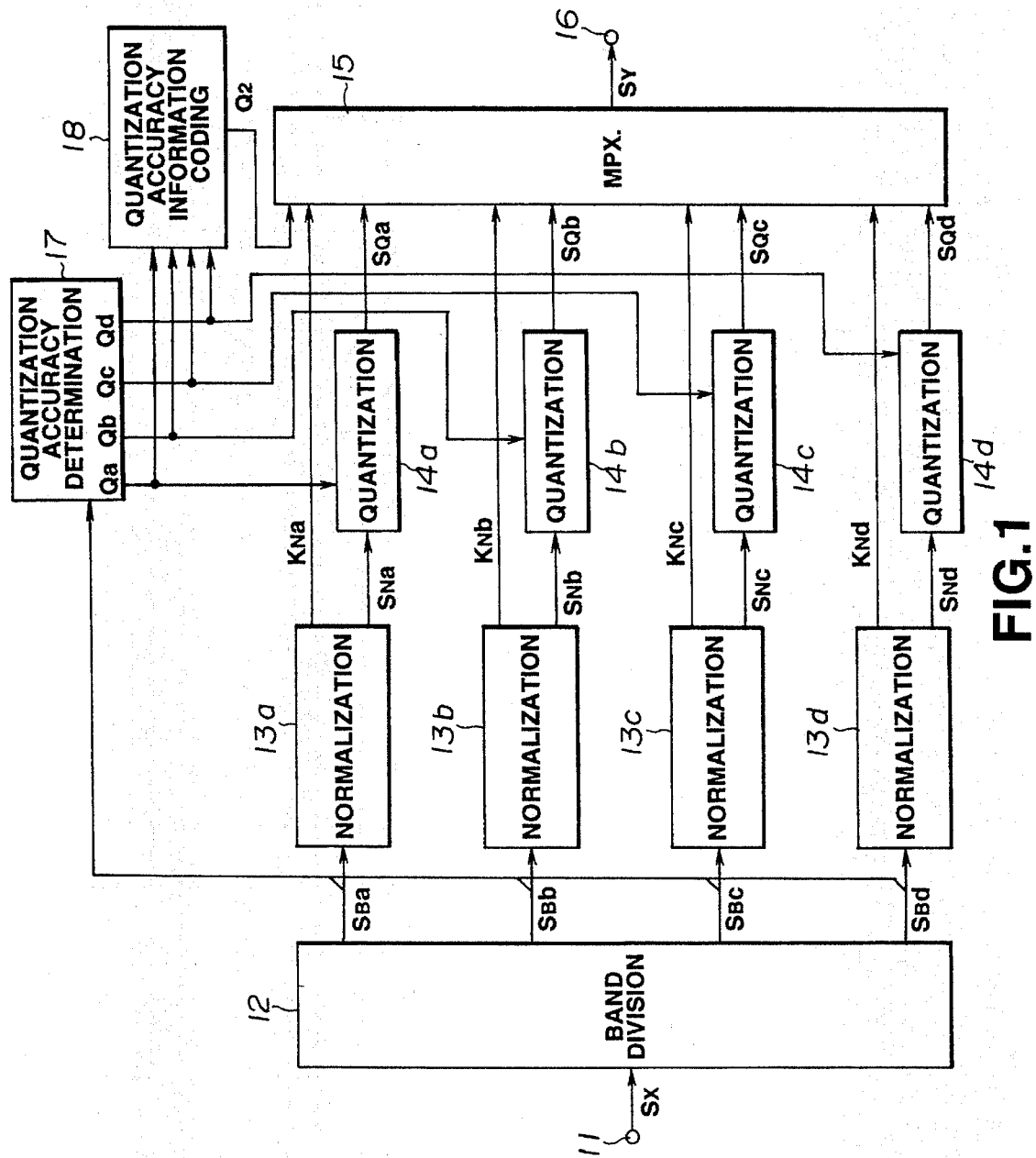
FIG. 1 is a block diagram showing an embodiment of a coder according to this invention.

FIG. 1 is a block diagram showing a coder for a digital audio signal as an embodiment of this invention.

In the coder shown in FIG. 1, an audio input signal $S_x$ inputted to input terminal 11 is band-divided into signals $S_{Ba}$, $S_{Bb}$, $S_{Bc}$, $S_{Bd}$ by a band division unit 12. As the band division unit 12, filter means such as QMF, etc. may be used, or means for grouping a spectrum obtained by spectrum transform processing such as MDCT, etc. into spectrum components by bands may be used. Further, there may be used means for implementing spectrum transform processing to signal components once divided every several bands by a filter or filters to group the spectrum components thus obtained into bands. In addition, the widths of respective bands may be uniform, or may be uneven so that they are in correspondence with, e.g., critical band width. Although the band is divided into four bands in the example of FIG. 1, it is of course that the divisional number may be more or less than 4.

Normalization is implemented to the band-divided signals $S_{Ba}$, $S_{Bb}$, $S_{Bc}$, $S_{Bd}$ by normalization units 13a, 13b, 13c, 13d in respective bands every predetermined time blocks, so they are decomposed (separated) into normalization coefficients $K_{Na}$, $K_{Nb}$, $k_{Nc}$, $K_{Nd}$ and normalized output signals $S_{Na}$, $S_{Nb}$, $S_{Nc}$, $S_{Nd}$. At the normalization units 13a, 13b, 13c, 13d, normalization is carried out, in respective bands, e.g., by the maximum values of absolute values of signal components in those bands. These normalized output signals $S_{Na}$, $S_{Nb}$, $S_{Nc}$, $S_{Nd}$ are quantized by quantization units 14a, 14b, 14c, 14d on the basis of quantization accuracy information $Q_a$, $Q_b$, $Q_c$, $Q_d$ which are respectively outputs from a quantization accuracy determination unit 17, so they are converted to normalized/quantized output signals $S_{Qa}$, $S_{Qb}$, $S_{Qc}$, $S_{Qd}$. As quantization accuracy information $Q_a$, $Q_b$, $Q_c$, $Q_d$, such quantization bit allocation information to indicate quantization bit numbers in quantization in respective bands is conceivable in actual sense.

The quantization accuracy information $Q_a$, $Q_b$, $Q_c$, $Q_d$ from the quantization accuracy determination unit 17 is coded into quantization accuracy information $Q_2$ by a quantization accuracy information coding unit 18. In the quantization accuracy information coding unit 18, means for generating first quantization accuracy information as described later is provided. By this first quantization accuracy information and second quantization accuracy information (substantially corresponding to the quantization accuracy information $Q_2$) sent to a decoder, quantization accuracies (corresponding to the quantization accuracy information $Q_a$, $Q_b$, $Q_c$, $Q_d$) in carrying out quantization at the quantization units 14a, 14b, 14c, 14d are determined.

The normalized/quantized output signals $S_{Qa}$, $S_{Qb}$, $S_{Qc}$, $S_{Qd}$, the normalization coefficients $K_{Na}$, $K_{Nb}$, $K_{Nc}$, $K_{Nd}$, and quantization accuracy information $Q_2$ which are obtained in this way are sequentially outputted as a code train signal $S_y$ by a multiplexer 15, and are then recorded and transmitted.

In the example of FIG. 1, quantization accuracy information $Q_a$, $Q_b$, $Q_c$, $Q_d$ from the quantization accuracy determination unit 17 is calculated on the basis of the band-divided signals $S_{Ba}$, $S_{Bb}$, $S_{Bc}$, $S_{Bd}$. As this information, information calculated from input signal $S_x$ or information calculated on the basis of the normalization coefficients $K_{Na}$, $K_{Nb}$, $K_{Nc}$, $K_{Nd}$ may be employed. While calculation at the quantization accuracy determination unit 17 can be carried out on the basis of the hearing sense phenomenon such as so called masking effect, etc., since the final quantization accuracy information is sent to the decoder, a hearing sense model used at the decoder may be arbitrarily set.

Figure 2:
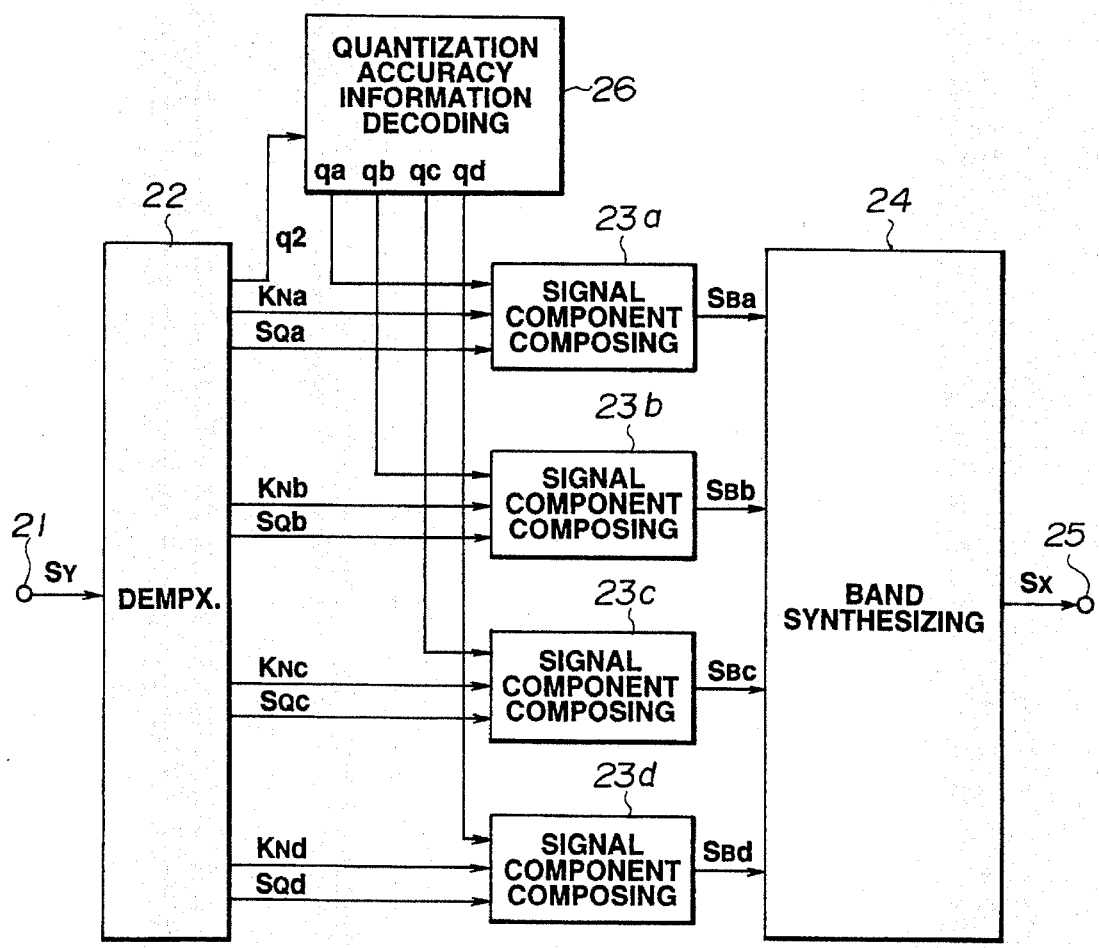
FIG. 2 is a block diagram showing an embodiment of a decoder according to this invention.

FIG. 2 is a block diagram showing an embodiment of a decoder corresponding to the coder shown in FIG. 1.

In FIG. 2, a signal $s_y$ delivered to input terminal 21 of the decoder is a signal of coded information obtained as the result of the fact that the code train output signal $S_y$ outputted from the coder of FIG. 1 is, e.g., recorded or reproduced through, a recording medium, or transmitted or recorded through a communication medium. Namely, if error, etc. does not take place at the time of transmission (at the time of transmission or reception, or at the time of recording or reproduction), the signal $S_y$ in FIG. 2 takes the same value as the signal $S_y$ in FIG. 1.

This inputted coded information signal $S_y$ is sent to a demultiplexer 22, at which normalization coefficients $k_{Na}$, $k_{Nb}$, $k_{Nc}$, $k_{Nd}$ respectively corresponding to the normalization coefficients $k_{Na}$, $k_{Nb}$, $k_{Nc}$, $k_{Nd}$, signals $s_{Qa}$, $s_{Qb}$, $s_{Qc}$, $s_{Qd}$ respectively corresponding to the normalized/quantized output signals $S_{Qa}$, $S_{Qb}$, $S_{Qc}$, $S_{Qd}$, and quantization accuracy information $q_2$ corresponding to the quantization accuracy information $Q_2$ are restored and separated. These coefficients $k_{Na}$, $k_{Nb}$, $k_{Nc}$, $k_{Nd}$, signals $s_{Qa}$, $s_{Qb}$, $s_{Qc}$, $s_{Qd}$, and quantization accuracy information $q_2$ also respectively take the same values of normalization coefficients $K_{Na}$, $K_{Nb}$, $K_{Nc}$, $K_{Nd}$, normalized/quantized output signals $S_{Qa}$, $S_{Qb}$, $S_{Qc}$, $S_{Qd}$, and quantization accuracy information $Q_2$ on the side of the coder if there is no transmission error, etc. as described above.

The quantization accuracy information $q_2$ obtained from the demultiplexer 22 is sent to a quantization accuracy information decoding unit 26 of a structure as described later, at which it is converted to quantization accuracy information $q_a$, $q_b$, $q_c$, $q_d$ respectively corresponding to the quantization accuracy information $Q_a$, $Q_b$, $Q_c$, $Q_d$. This quantization accuracy information $q_a$, $q_b$, $q_c$, $q_d$ also takes the same values as quantization accuracy of information $Q_a$, $Q_b$, $Q_c$, $Q_d$ on the side of the coder unless there is any transmission error, etc.

The quantization accuracy information $q_a$, $q_b$, $q_c$, $q_d$, normalization coefficients $k_{Na}$, $k_{Nb}$, $k_{Nc}$, $k_{Nd}$, and normalized/quantized output signals $s_{Qa}$, $s_{Qb}$, $s_{Qc}$, $s_{Qd}$ in respective bands which are obtained in this way are sent to signal component composing units 23a, 23b, 23c, 23d for the respective bands. At these signal component composing units 23a, 23b, 23c, 23d, signal components respectively corresponding to the band-divided signals $S_{Ba}$, $S_{Bb}$, $S_{Bc}$, $S_{Bd}$ of FIG. 1 are composed. These signal components $s_{Ba}$, $s_{Bb}$, $s_{Bc}$, $s_{Bd}$ are synthesized by a band synthesizing unit 24, whereby an audio signal $s_x$ corresponding to the input signal $S_x$ of FIG. 1 is taken out from output terminal 25.

In accordance with the embodiment as mentioned above, in the coder shown in FIG. 1, quantization accuracy information $Q_a$, $Q_b$, $Q_c$, $Q_d$ in the respective bands is coded at the coding unit 18. This quantization accuracy information $Q_a$, $Q_b$, $Q_c$, $Q_d$ is determined by first quantization accuracy information from the quantization accuracy information generating means provided in the coding unit 18 and information $Q_2$ coded and sent to the decoder. Accordingly, as compared to the case where quantization accuracy information $Q_a$, $Q_b$, $Q_c$, $Q_d$ in the respective bands is sent (transmitted or received, or recorded or reproduced) as is, the number of bits can be reduced. Thus, the entire coding efficiency can be improved.

Figure 3:
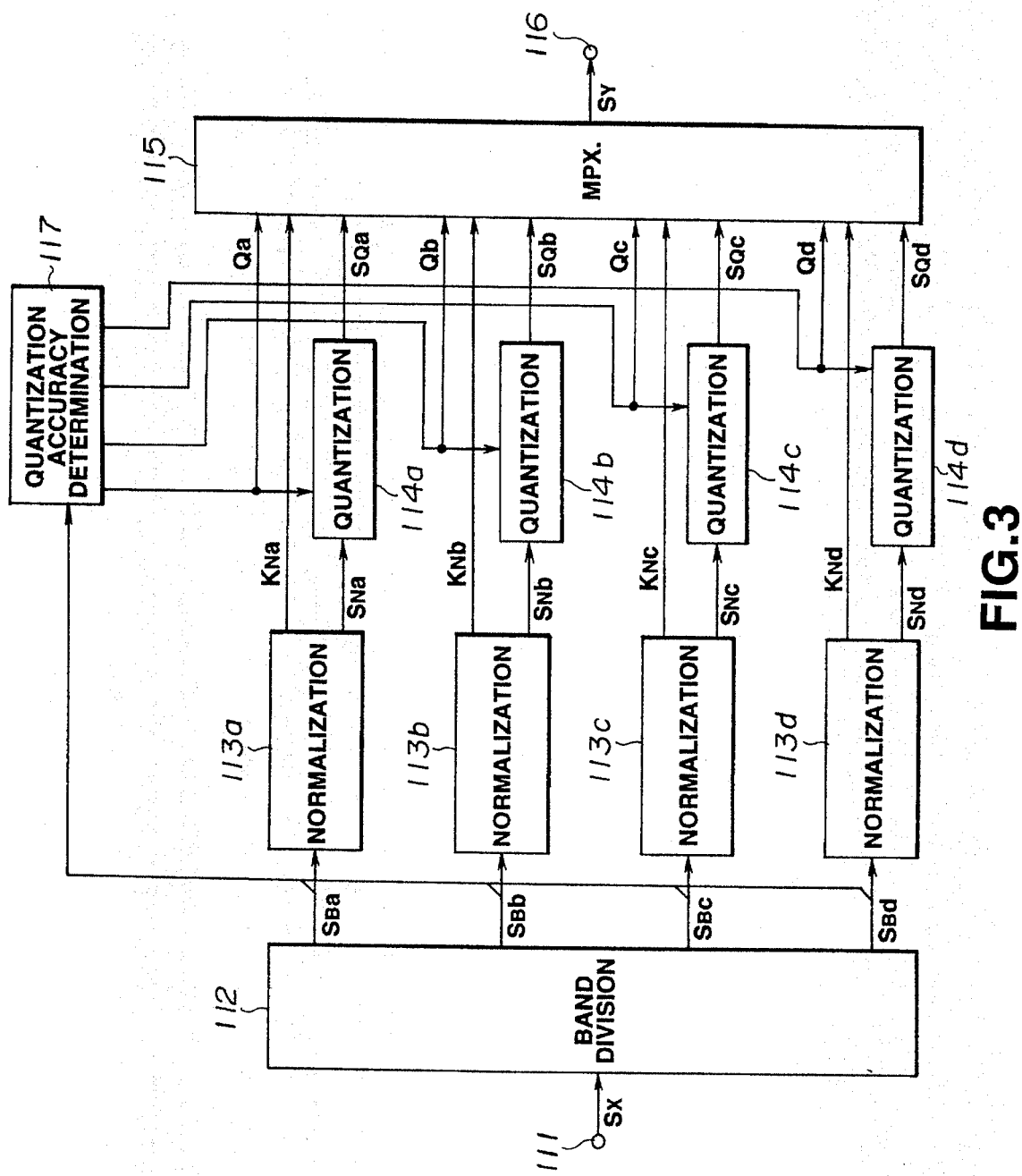
FIG. 3 is a block diagram showing a comparative example of a coder for comparison with this invention.
Figure 4:
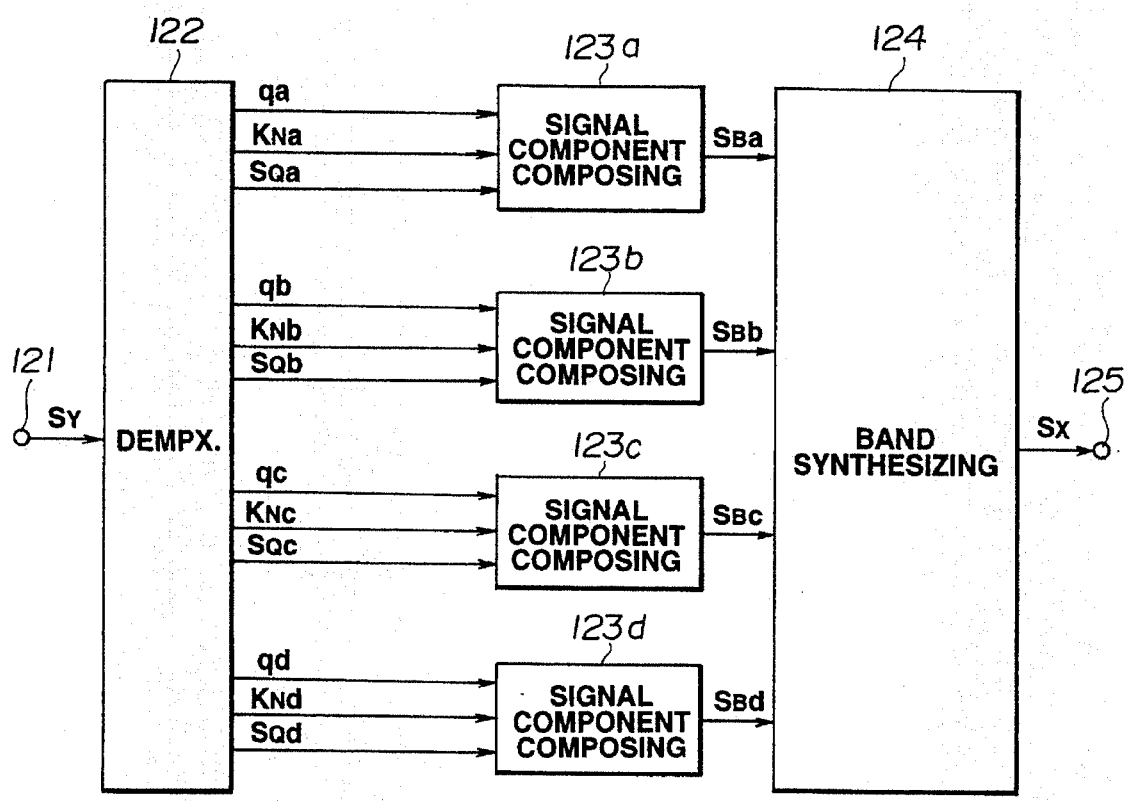
FIG. 4 is a block diagram showing a comparative example of a decoder for comparison with this invention.

It is to be noted that FIGS. 3 and 4 are block diagrams showing, for making comparison with the embodiments of this invention, examples (comparative examples) of a coder and a decoder where the quantization accuracy information coding unit 18 and quantization accuracy information decoding unit 26 are not respectively provided.

In the coder shown in FIG. 3, input terminal 111 is supplied with a digital audio signal $S_x$. A band division unit 112, normalization units for the respective bands 113a, 113b, 113c, 113d, and quantization units 114a, 114b, 114c, 114d are respectively the same as the band division unit 12, the normalization units 13a, 13b, 13c, 13d, and quantization units 14a, 14b, 14c, 14d of FIG. 1, and their explanation is therefore omitted. A quantization accuracy determination unit 117 calculates quantization accuracy information $Q_a$, $Q_b$, $Q_c$, $Q_d$ in the respective bands on the basis of, e.g., signals $S_{Ba}$, $S_{Bb}$, $S_{Bc}$, $S_{Bd}$ for the respective bands from the band division unit 112. The quantization accuracy information $Q_a$, $Q_b$, $Q_c$, $Q_d$ in the respective bands, normalization coefficients $K_{Na}$, $K_{Nb}$, $K_{Nc}$, $K_{Nd}$ from the normalization units 113a, 113b, 113c, 113d, normalized/quantized output signals $S_{Qa}$, $S_{Qb}$, $S_{Qc}$, $S_{Qd}$ from the quantization units 114a, 114b, 114c, 114d are sent to a multiplexer 115, and are sequentially taken out from output terminal 116 as a signal $S_y$ of a code train.

FIG. 4 shows a decoder corresponding to the coder of FIG. 3. To input terminal 121 of the decoder, a signal $s_y$ transmitted as the result of the fact that signal $S_y$ outputted from the coder of FIG. 3 is, e.g., transmitted or received through a communication medium, or recorded or reproduced through a recording medium is inputted. At a demultiplexer 122, quantization accuracy information $q_a$, $q_b$, $q_c$, $q_d$ respectively corresponding to the quantization accuracy information $Q_a$, $Q_b$, $Q_c$, $Q_d$ is directly obtained. This information is sent to signal component composing units 123a, 123b, 123c, 123d for the respective bands together with normalization coefficients $k_{Na}$, $k_{Nb}$, $k_{Nc}$, $k_{Nd}$ respectively corresponding to the normalization coefficients $k_{Na}$, $k_{Nb}$, $k_{Nc}$, $k_{Nd}$ and signals $s_{Qa}$, $s_{Qb}$, $s_{Qc}$, $s_{Qd}$ respectively corresponding to the normalized/quantized output signals $S_{Qa}$, $S_{Qb}$, $S_{Qc}$, $S_{Qd}$. At these signal component composing units 123a, 123b, 123c, 123d, signal components $s_{Ba}$, $s_{Bb}$, $s_{Bc}$, $s_{Bd}$ respectively corresponding to the band-divided signal components $s_{Ba}$, $s_{Bb}$, $s_{Bc}$, $s_{Bd}$ of FIG. 3 are composed. These signal components are synthesized by a band synthesizing unit 124. Thus, an audio signal $s_x$ corresponding to the input signal $S_x$ of FIG. 3 is taken out from output terminal 125.

In the coder and the decoder as respectively shown in FIGS. 3 and 4, since quantization accuracy information $Q_a$, $Q_b$, $Q_c$, $Q_d$ itself is sent from the coder to the decoder, it is possible to freely set quantization accuracies in respective bands in the coder. This makes it possible to make, without altering the decoder, improvement in the sound quality or improvement in the compression factor with improvement in the computational ability of the coder or improvement of the hearing sense model. However, the number of bits for coding quantization accuracy information itself is increased, resulting in the drawback that the overall coding efficiency is not high enough.

To eliminate drawbacks as described above, the coder and the decoder of the above-described embodiments of FIGS. 1 and 2 are proposed.

Figure 5:
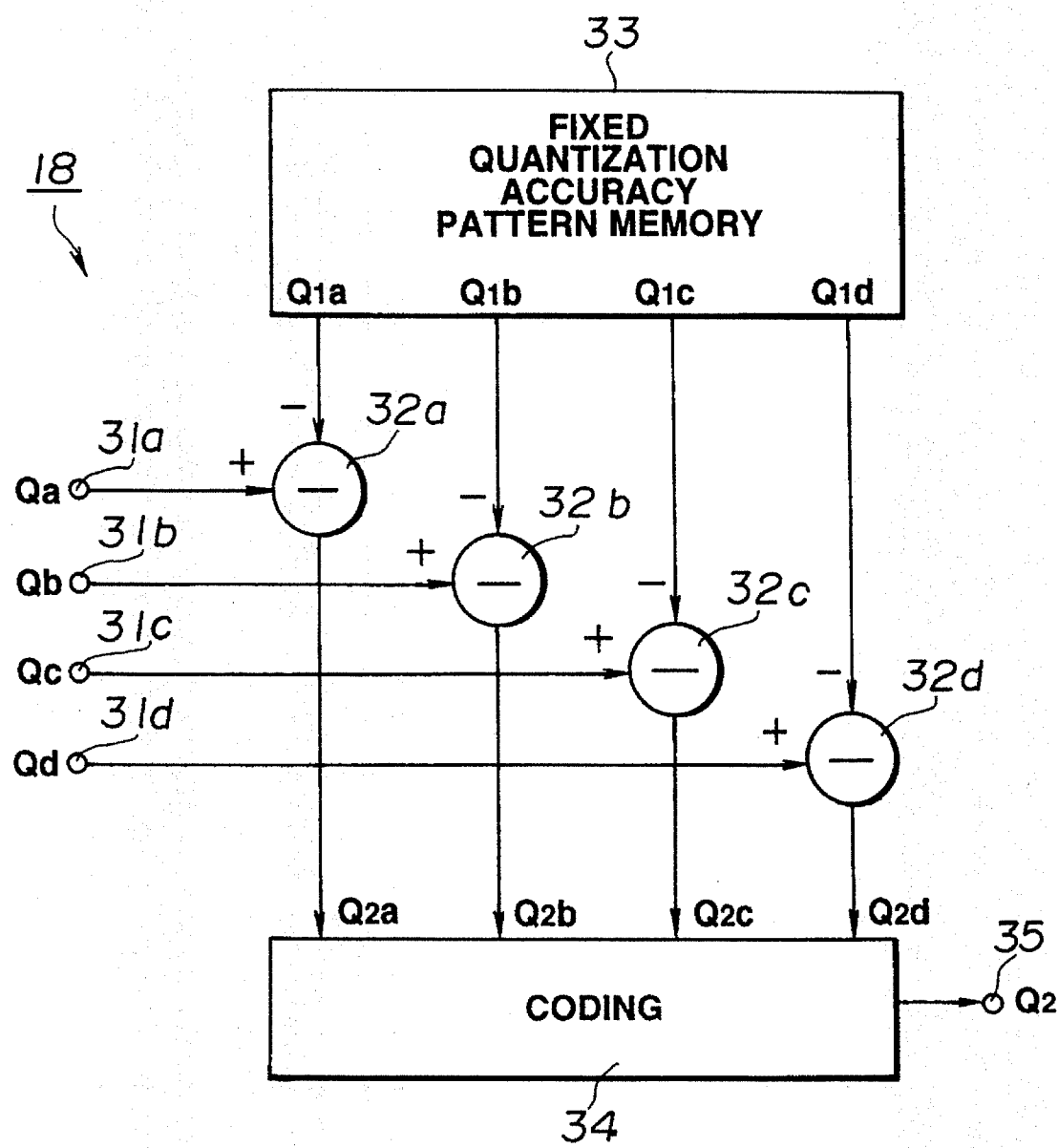
FIG. 5 is a block diagram showing an actual example of the configuration of a quantization accuracy coding unit in the embodiment of the coder according to this invention.

An actual example of the configuration of the quantization accuracy information coding unit 18 used in the above-described coder of FIG. 1 is shown in FIG. 5.

The quantization accuracy information coding unit 18 shown in FIG. 5 includes a fixed quantization accuracy pattern memory section 33. From this fixed quantization accuracy pattern memory section 33, first quantization accuracy information $Q_{1a}$, $Q_{1b}$, $Q_{1c}$, $Q_{1d}$ fixedly determined in respective bands is outputted. This first quantization accuracy information $Q_{1a}$, $Q_{1b}$, $Q_{1c}$, $Q_{1d}$ is sent to subtracters 32a, 32b, 32c, 32d to take differences between quantization accuracy information, $Q_a$, $Q_b$, $Q_c$, $Q_d$ from the quantization accuracy determination unit 17 of FIG. 1 and the above-mentioned first quantization accuracy information $Q_{1a}$, $Q_{1b}$, $Q_{1c}$, $Q_{1d}$ ($Q_a - Q_{1a}$, etc.) to thereby determine quantization accuracy difference information $Q_{2a}$, $Q_{2b}$, $Q_{2c}$, $Q_{2d}$ which is second quantization accuracy information. This quantization accuracy difference information $Q_{2a}$, $Q_{2b}$, $Q_{2c}$, $Q_{2d}$ is sent to a coding section 34, at which it is coded. Thus, quantization accuracy information $Q_2$ for transmission (transmission or recording) is taken out from output terminal 35.

Since the first quantization accuracy information $Q_{1a}$, $Q_{1b}$, $Q_{1c}$, $Q_{1d}$ fixedly determined in respective bands is set to such values to approximate to actual quantization accuracy information $Q_a$, $Q_b$, $Q_c$, $Q_d$ in many cases, there are many instances where the values of the quantization accuracy difference information $Q_{2a}$, $Q_{2b}$, $Q_{2c}$, $Q_{2d}$ take a value close to zero. In view of this, if a scheme is employed to apply coding (so called variable length coding) to difference signals by a shorter bit length when the absolute value of a difference signal is small and by a bit length which becomes longer according as a difference signal becomes greater, quantization accuracy information can be sent by a lesser number of bits. Further, quantization accuracy difference information $Q_{2a}$, $Q_{2b}$, $Q_{2c}$, $Q_{2d}$ can be coded by a fixed number of bits. At this time, if the fixed number of bits is set to a value smaller than the number of bits required when quantization accuracy information $Q_a$, $Q_b$, $Q_c$, $Q_d$ for the respective bands is directly coded, it is possible to send information relating to quantization accuracy by a lesser quantity of information. In this case, the degree of freedom of quantization accuracy information is limited. However, since quantization accuracy information $Q_{1a}$, $Q_{1b}$, $Q_{1c}$, $Q_{1d}$ fixedly determined in respective bands is set to information in advance such that it can ensure sound quality to some extent, employment of this method does not constitute a great problem.

Figure 6:
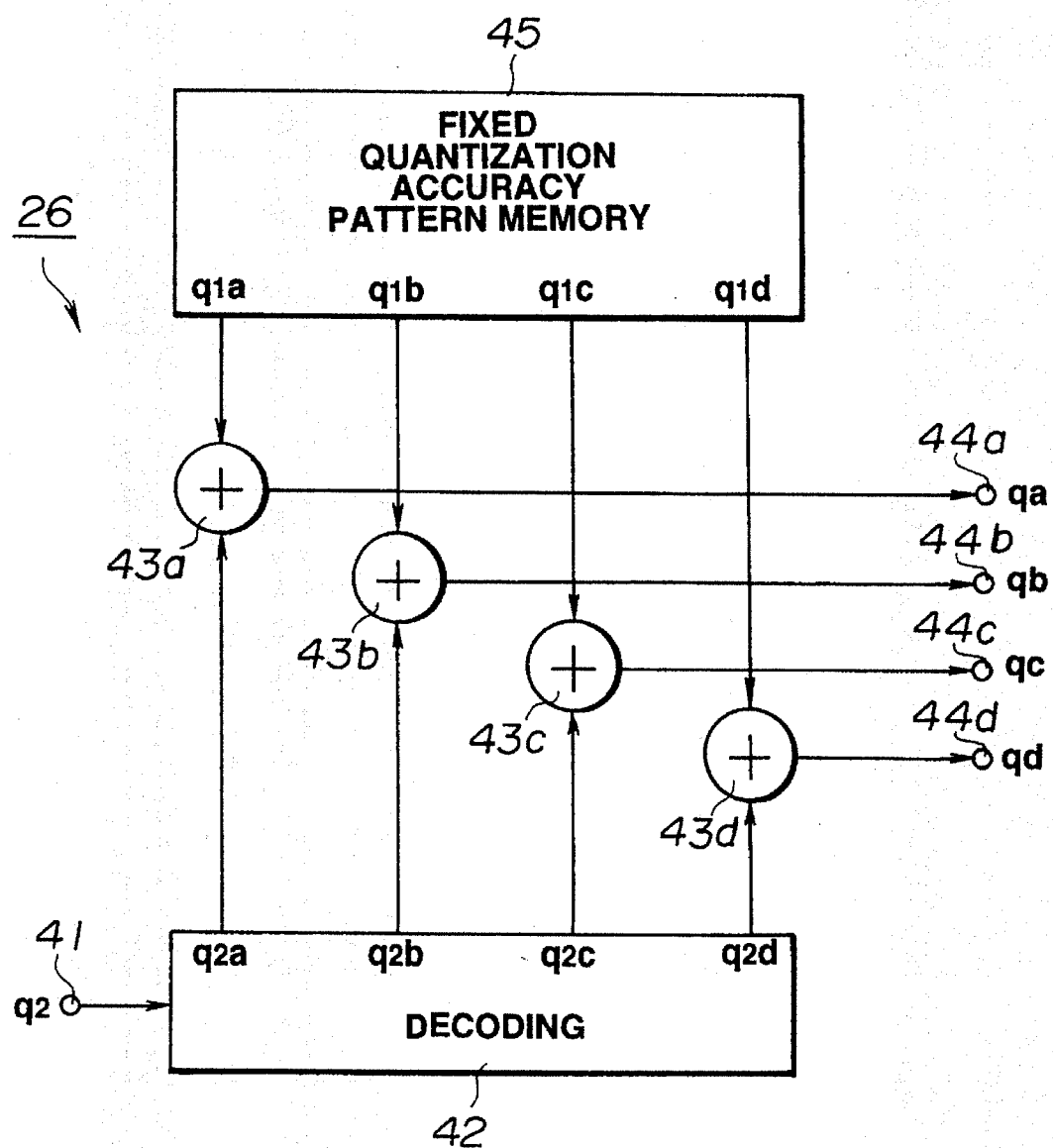
FIG. 6 is a block diagram showing an actual example of the configuration of a quantization accuracy decoding unit in the embodiment of the decoder according to this invention.

FIG. 6 shows the detail of quantization accuracy decoding unit 26 in the decoder shown in FIG. 2. Namely, this figure shows an actual example of the configuration of the quantization accuracy decoding unit 26 corresponding to the quantization accuracy information coding unit 18 of FIG. 5.

In FIG. 6, input terminal 41 is supplied with quantization accuracy information $q_2$ (corresponding to the quantization accuracy information $Q_2$) restored and separated in the demultiplexer 22 of the decoder of FIG. 2. This quantization accuracy information $q_2$ is sent to a decoding section 42, at which quantization accuracy difference information $q_{2a}$, $q_{2b}$, $q_{2c}$, $q_{2d}$ corresponding to quantization accuracy difference information $Q_{2a}$, $Q_{2b}$, $Q_{2c}$, $Q_{2d}$ which is second quantization accuracy information every respective bands is restored. This quantization accuracy difference information $q_{2a}$, $q_{2b}$, $q_{2c}$, $q_{2d}$ is respectively sent to adders 43a, 43b, 43c, 43d, at which it is respectively added, in the respective bands, to quantization accuracy information $q_{1a}$, $q_{1b}$, $q_{1c}$, $q_{1d}$ outputted from a fixed quantization accuracy pattern memory section 45. This fixed quantization accuracy information $q_{1a}$, $q_{1b}$, $q_{1c}$, $q_{1d}$ for the respective bands corresponds to (has the same values as) first quantization accuracy information $Q_{1a}$, $Q_{1b}$, $Q_{1c}$, $Q_{1d}$ fixedly determined in respective bands from the fixed quantization accuracy pattern memory section 33 of FIG. 5, respectively. Quantization accuracy information $q_a$, $q_b$, $q_c$, $q_d$ which is added outputs from adders 43a, 43b, 43c, 43d in the respective bands corresponds to quantization accuracy information $Q_a$, $Q_b$, $Q_c$, $Q_d$ on the side of the coder, and take the same values as those values (when there is no transmission error, or the like) in a theoretical sense. This quantization accuracy information $q_a$, $q_b$, $q_c$, $q_d$ is outputted from output terminals 44a, 44b, 44c, 44d, and is sent to the signal components composing units 23a, 23b, 23c, 23d of FIG. 2, respectively.

Figure 7:
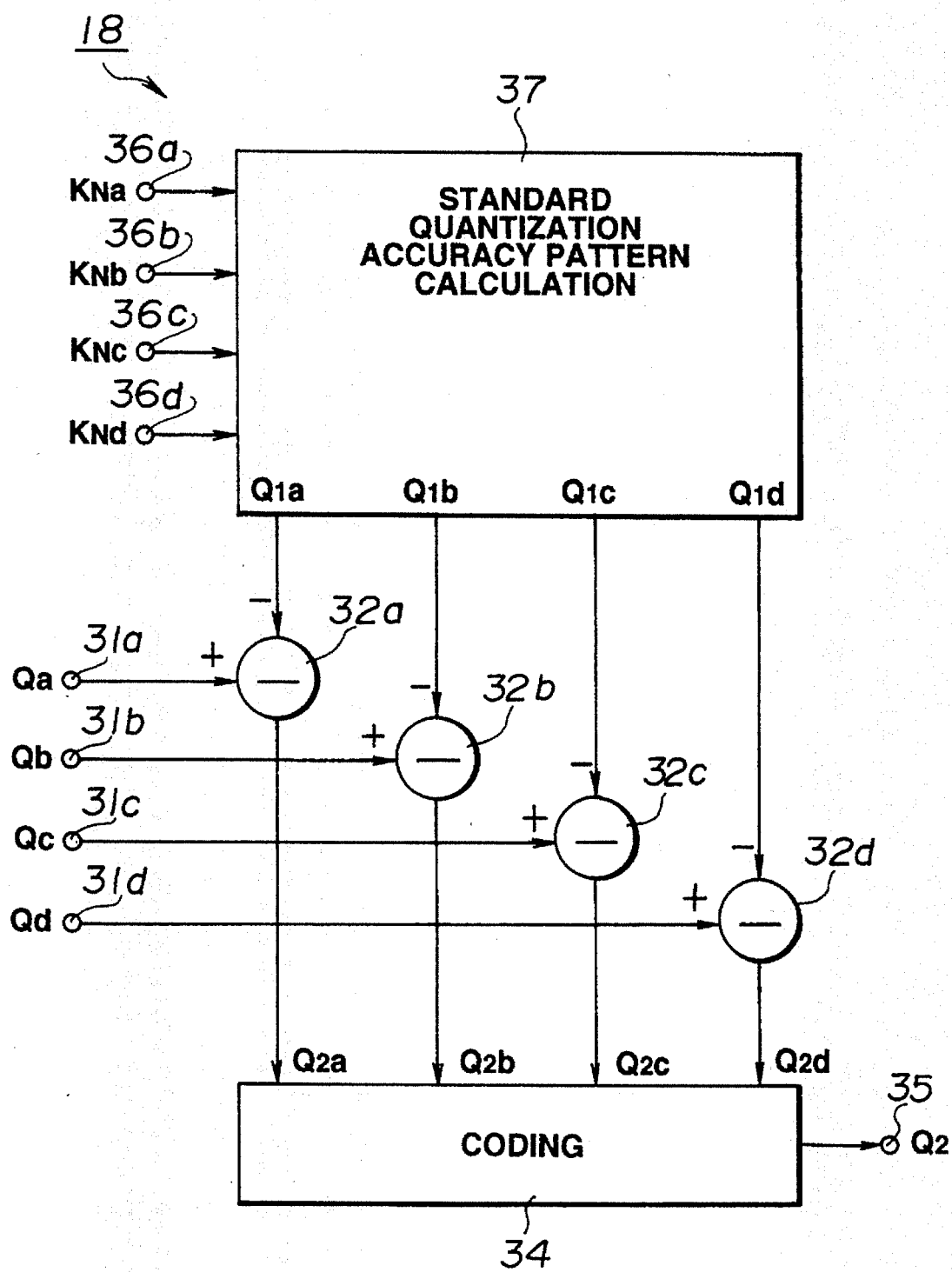
FIG. 7 is a block diagram showing another example of the quantization accuracy coding unit in the embodiment of the coder according to this invention.
Figure 8:
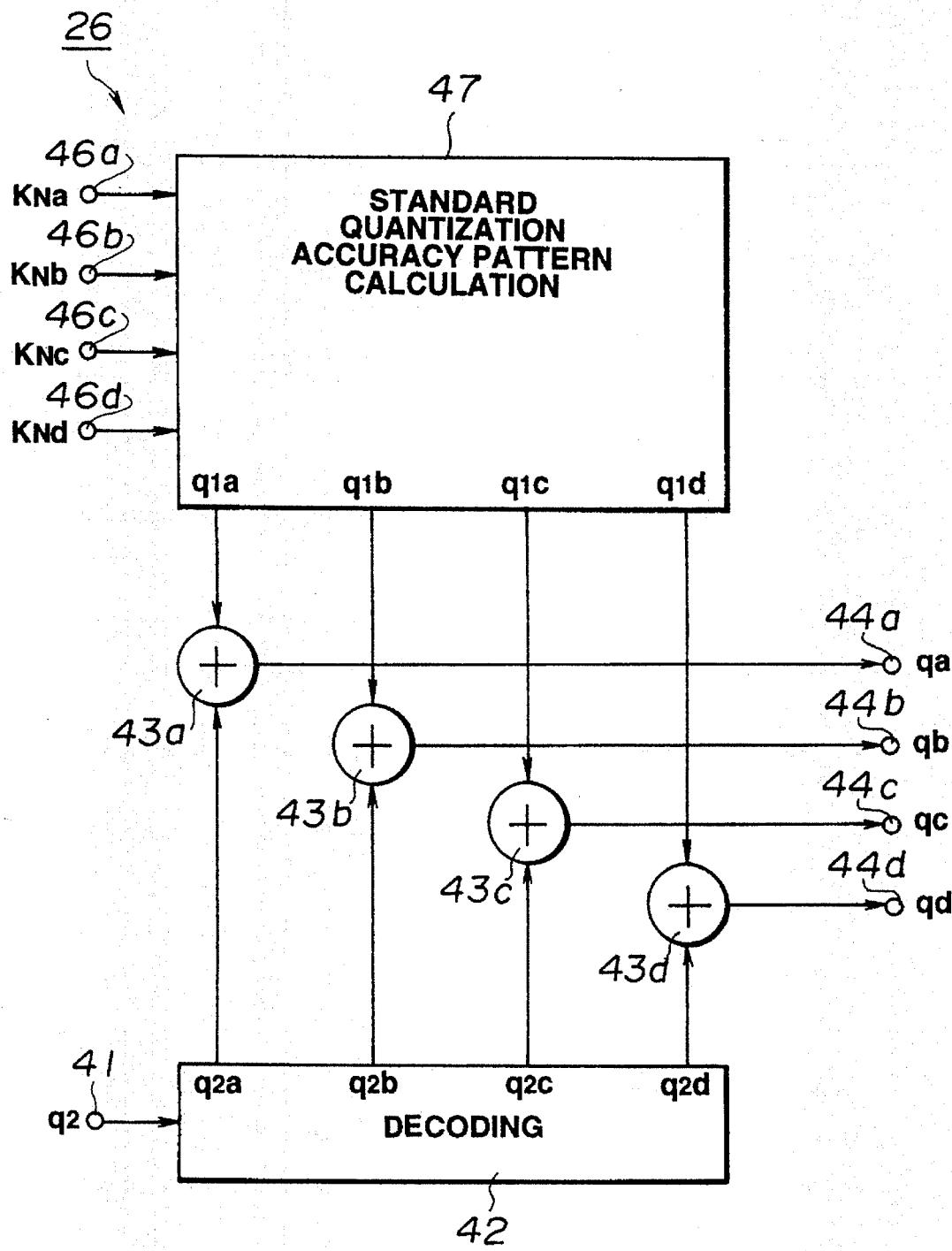
FIG. 8 is a block diagram showing another example of the quantization accuracy decoding unit in the embodiment of the decoder according to this invention.

FIG. 7 is a block diagram showing another actual example of the quantization accuracy information coding unit, 18 used in the coder of FIG. 1, and FIG. 8 is a block diagram showing another example of the quantization accuracy decoding unit 26 in the decoder shown in FIG. 2 wherein there is shown an actual example of the configuration of the quantization accuracy decoding unit corresponding to the quantization accuracy information coding unit of FIG. 7.

In the quantization accuracy information coding unit and the quantization accuracy decoding unit respectively shown in FIGS. 7 and 8, quantization accuracy difference information which is the second quantization accuracy information is determined as differences between the quantization accuracy information outputted from the quantization accuracy determination unit and the first quantization accuracy information. As the first quantization accuracy information, outputs of standard quantization accuracy pattern calculation means are used in this embodiment in place of outputs of the fixed quantization accuracy information pattern memory means. In the calculation of the standard quantization accuracy pattern in this case, e.g., values of normalization coefficients can be utilized. By employing such a method, the values of quantization accuracy difference information can concentrate on a value closer to zero. Thus, more efficient coding can be carried out.

Initially, in the quantization accuracy information coding unit 18 shown in FIG. 7, the same reference numerals are respectively attached to portions corresponding to respective portions of FIG. 5, and because these portions are the same in the configuration and the operation as those in FIG. 5, their explanation is omitted. In the quantization accuracy information coding unit 18 of FIG. 7, a standard quantization accuracy pattern calculation section 37 is provided in place of the fixed quantization accuracy pattern memory section 33. This standard quantization accuracy pattern calculation section 37 is supplied with normalization coefficients $K_{Na}$, $K_{Nb}$, $K_{Nc}$, $K_{Nd}$ for the respective bands of FIG. 1, for example, through input terminals 36a, 36b, 36c, 36d.

The standard quantization accuracy pattern calculation section 37 determine by calculation the first quantization accuracy information $Q_{1a}$, $Q_{1b}$, $Q_{1c}$, $Q_{1d}$ by making use of values of these normalization coefficients $K_{Na}$, $K_{Nb}$, $K_{Nc}$, $K_{Nd}$. This first quantization accuracy information $Q_{1a}$, $Q_{1b}$, $Q_{1c}$, $Q_{1d}$ is sent to subtracters 32a, 32b, 32c, 32d to take differences between the quantization accuracy information $Q_a$, $Q_b$, $Q_c$, $Q_d$ and the first quantization accuracy information $Q_{1a}$, $Q_{1b}$, $Q_{1c}$, $Q_{1d}$ to thereby determine quantization accuracy difference information $Q_{2a}$, $Q_{2b}$, $Q_{2c}$, $Q_{2d}$ which is the second quantization accuracy information.

Further, in the quantization accuracy information decoding unit 26 shown in FIG. 8, the same reference numerals are respectively attached to portions corresponding to respective portions of FIG. 6, and because these portions are the same in the configuration and the operation as those of FIG. 6, their explanation is omitted. As the portion different in the configuration from FIG. 6, a standard quantization accuracy pattern calculation section 47 is provided in place of the fixed quantization accuracy pattern memory section 45. This standard quantization accuracy pattern calculation section 47 calculates the first quantization accuracy information $q_{1a}$, $q_{1b}$, $q_{1c}$, $q_{1d}$ on the basis of normalization coefficients $K_{Na}$, $K_{Nb}$, $K_{Nc}$, $K_{Nd}$ for the bands of FIG. 2, for example, given through input terminals 46a, 46b, 46c, 46d. This quantization accuracy difference information $q_{1a}$, $q_{1b}$, $q_{1c}$, $q_{1d}$ is respectively sent to adders 43a, 43b, 43c, 43d. In the same manner as in the case of FIG. 6, this information is added, in the respective bands, to the second quantization accuracy information $q_{2a}$, $q_{2b}$, $q_{2c}$, $q_{2d}$ outputted from the decoding section 42.

As stated above, an approach is employed to determine by calculation first quantization accuracy information on the basis of normalization coefficients in the respective bands to add them to second quantization accuracy information transmitted to determine quantization accuracy, thereby permitting the values of quantization accuracy difference information which is second quantization accuracy information to concentrate on a value closer to zero. Thus, more efficient coding can be carried out.

It is to be noted that this invention is not limited to the above-described embodiments. For example, as first quantization accuracy information which serves as reference information for determining quantization accuracy difference information, e.g., quantization accuracy information in any other time block, e.g., a block immediately before may be used in addition to the above-described information. Further, although the configuration is represented by functional block in the embodiments shown, such configuration can of course be realized by hardware or software.

What is claimed is:

1. A coding method for the coding of a digital signal comprising the steps of:

employing quantization accuracy information generating means to generate first quantization accuracy information, employing said first quantization accuracy information and second quantization accuracy information to determine a desired quantization accuracy of said digital signal, effecting quantization of said digital signal with said desired quantization accuracy, and sending said second quantization accuracy information to a decoder.

2. A coding method as set forth in claim 1 wherein said second quantization accuracy information is quantization accuracy difference information obtained by taking a difference between quantization accuracy information outputted from quantization accuracy determination means and said first quantization accuracy information.

3. A coding method as set forth in claim 1 wherein said first quantization accuracy information is fixed quantization accuracy information.

4. A coding method as set forth in claim 1 wherein said first quantization accuracy information is calculated on the basis of normalization coefficients in normalization carried out prior to said quantization of said digital signal.

5. A coding method as set forth in claim 1 wherein, when coding is implemented with respect to said digital signal, which is divided into current and other time blocks, said first quantization accuracy information relates to any of said other time blocks.

6. A coding method as set forth in claim 5 wherein said first quantization accuracy information relates to a time block earlier than said current time block.

7. A coding method as set forth in claim 1 wherein said second quantization accuracy information is subjected to variable length coding before being sent to said decoder.

8. A coding method as set forth in claim 1 wherein said second quantization accuracy information has a fixed length.

9. A coder for coding a digital signal comprising:

quantization accuracy information generating means for generating first quantization accuracy information;

means for generating second quantization accuracy information;

means for carrying out quantization of said digital signal with a quantization accuracy determined by said first quantization accuracy information and said second quantization accuracy information; and means for sending said second quantization accuracy information to a decoder.

10. A coder as set forth in claim 9, further comprising quantization accuracy determination means, and difference means, wherein said second quantization accuracy information is quantization accuracy difference information obtained from said difference means by taking a difference between quantization accuracy information outputted from said quantization accuracy determination means and said first quantization accuracy information.

11. A coder as set forth in claim 9 wherein said first quantization accuracy information is fixed quantization accuracy information.

12. A coder as set forth in claim 9, further comprising coefficient normalization means, wherein said first quantization accuracy information is calculated on the basis of normalization coefficients in normalization carried out by said normalization means prior to said quantization of said digital signal.

13. A coder as set forth in claim 9 wherein, when coding is implemented with respect to said digital signal, which is divided into current and other time blocks, said quantization accuracy information relates to any of said other time blocks.

14. A coder as set forth in claim 13 wherein said first quantization accuracy information relates to a time block earlier than said current time block.

15. A coder as set forth in claim 9 wherein said second quantization accuracy information is subjected to variable length coding before being sent to said decoder.

16. A coder as set forth in claim 9 wherein said second quantization accuracy information has a fixed length.

17. A decoder for decoding a coded information signal produced when a digital signal is coded by a coder generating coder-generated first quantization accuracy information and coder-generated second quantization accuracy information, said decoder comprising:

means for receiving said coded information signal from the coder;

quantization accuracy information generating means generating decoder-generated first quantization accuracy information; and means for determining a quantization accuracy of said digital signal with the quantization accuracy of said digital signal being determined by said decoder-generated first quantization accuracy information outputted from said quantization accuracy information generating means and said coder-generated second quantization accuracy information sent from said coder.

18. A decoder as set forth in claim 17 wherein said coder includes difference means and wherein said coder-generated second quantization accuracy information is quantization accuracy difference information obtained from said difference means by taking a difference between quantization accuracy information outputted from quantization accuracy determination means in said coder and said coder-generated first quantization accuracy information.

19. A decoder as set forth in claim 17 wherein said coder-generated first quantization accuracy information and said decoder-generated first quantization accuracy information are of a fixed quantization accuracy.

20. A decoder as set forth in claim 17 wherein said coder includes normalization means and wherein said coder-generated first quantization accuracy information and said decoder-generated first quantization accuracy information are calculated on the basis of normalization coefficients in normalization carried out by said normalization means prior to said quantization of said digital signal.

21. A decoder as set forth in claim 17 wherein said coder includes divider means and wherein, when coding is implemented with respect to said digital signal, which is divided by said divider means into current and other time blocks, said coder-generated first quantization accuracy information and said decoder-generated first quantization accuracy information relate to any of said other time blocks.

22. A decoder as set forth in claim 21 wherein said coder-generated first quantization accuracy information and said decoder-generated first quantization accuracy information relate to a time block earlier than said current time block.

23. A decoder as set forth in claim 17 wherein said coder-generated second quantization accuracy information is subjected to variable length coding.

24. A decoder as set forth in claim 17 wherein said coder-generated second quantization accuracy information has a fixed length.

* * * * *